United States Patent

[11] 3,577,008

[72] Inventor Jack Craft
Somerville, N.J.

[21] Appl. No. 792,983
[22] Filed Jan. 22, 1969
[45] Patented May 4, 1971
[73] Assignee RCA Corporation

[54] AUTOMATIC FREQUENCY CONTROL APPARATUS
6 Claims, 1 Drawing Fig.

[52] U.S. Cl. .......... 307/233, 307/235, 307/295, 328/134, 330/30, 328/141
[51] Int. Cl. .......... H03k 5/20
[50] Field of Search .......... 328/134, 141; 307/233, 235, 295; 330/30 (D); 329/103 (Inquired)

[56] References Cited

UNITED STATES PATENTS

| | | | |
|---|---|---|---|
| 3,164,777 | 1/1965 | Guanella | 328/134 |
| 3,223,929 | 12/1965 | Hofstad et al. | 307/233X |
| 3,265,976 | 8/1966 | Broadhead | 328/134X |
| 3,275,945 | 9/1966 | Walker et al. | 330/30 |
| Re26,210 | 5/1967 | Russell | 329/103 |
| 3,471,792 | 10/1969 | Axford | 307/233X |

*Primary Examiner*—John S. Heyman
*Attorney*—Eugene M. Whitacre

ABSTRACT: Automatic frequency control apparatus including a differential amplifier-detector biased so as to be responsive only to signals exceeding a predetermined amplitude value established to effectively reduce undesired pull-in of adjacent signal frequencies.

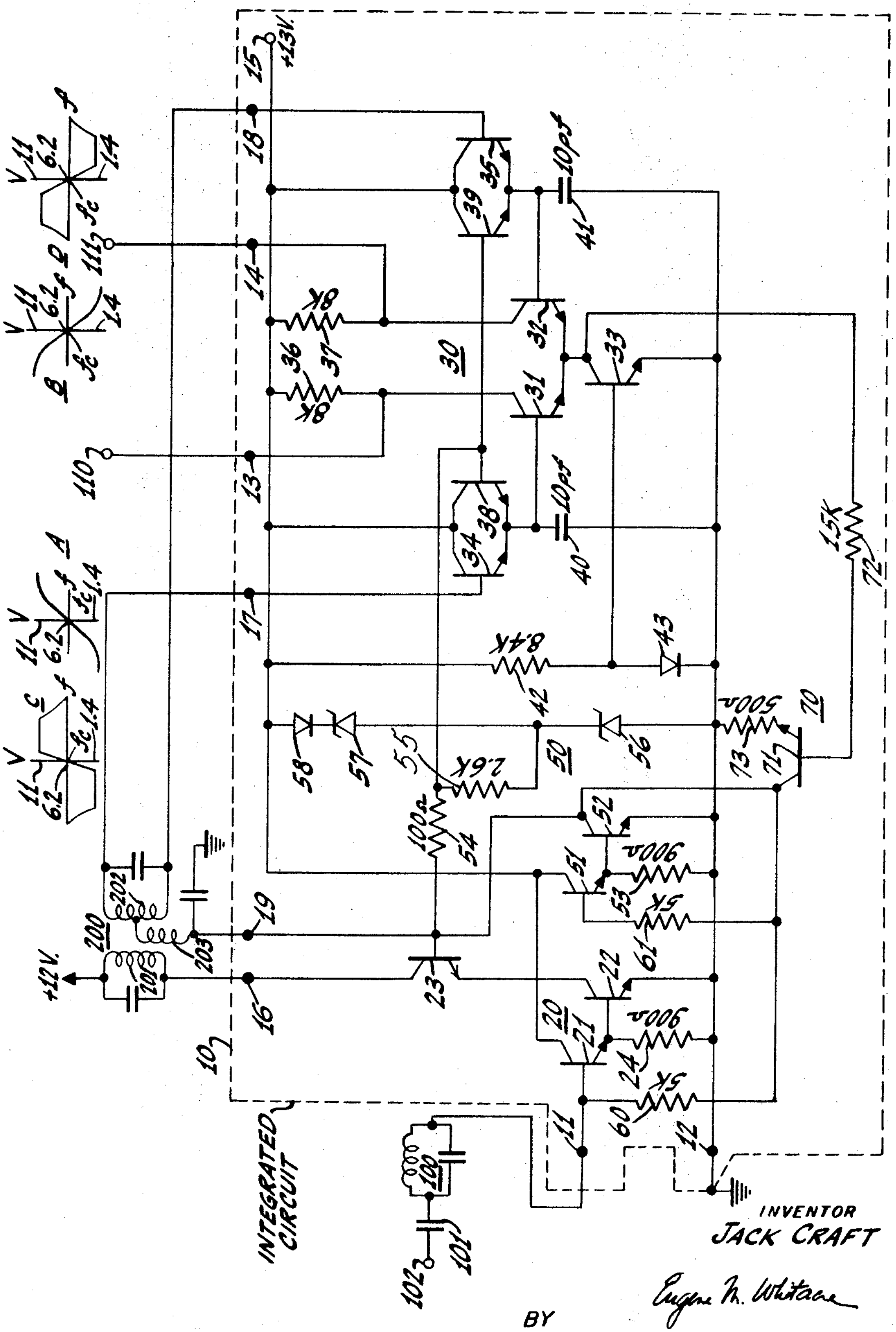
INVENTOR
JACK CRAFT
BY Eugene M. Whitacre
ATTORNEY

AUTOMATIC FREQUENCY CONTROL APPARATUS

This invention relates to automatic frequency control apparatus in general, and to such apparatus for deriving a frequency dependent error-correction voltage to control the tuning of a local oscillator in a superheterodyne receiver, in particular. More specifically, it relates to an improvement of the automatic frequency control system described in pending application Ser. No. 705,709, filed Feb. 15, 1968, and entitled "ANGLE MODULATION SYSTEM," now U.S. Pat. No. 3,519,944.

U.S. Pat. No. 3,519,944 describes an angle modulation wave-processing channel useful in the intercarrier sound system of either a monochrome or color television receiver. The processing channel is one which is particularly suited for fabrication using integrated circuit techniques and includes a plurality of limiter stages, a discriminator circuit for developing two opposite phase signals indicative of the angle modulation of an applied wave, and a difference or differential amplifier-detector for providing a single-ended demodulated output. U.S. Pat. No. 3,519,944 also describes how, with the amplifier-detector providing double-ended operation, the disclosed angle modulation wave-processing channel is useful in an automatic frequency control environment providing single-ended control signals for UHF operation and providing double-ended signals of VHF control.

As will become clear hereinafter, the automatic frequency control apparatus embodying the present invention serves to improve the control afforded by the apparatus suggested in the aforesaid patent. More particularly, the arrangement serves to improve the selectivity exhibited by the aforedescribed arrangement, by preventing conduction in the differential amplifier-detector until signals applied to it exceed a predetermined threshold value. In this manner, undesired pull-in from adjacent channel signals will be reduced.

In a preferred embodiment of the invention, a pair of transistors are connected in an emitter-follower configuration and serve to initially bias the detector portion of the differential amplifier detector so as prevent its operation until the predetermined threshold is reached.

For a better understanding of the automatic frequency control apparatus of the present invention, reference is had to the following description taken in connection with the single FIGURE of the drawing showing one of its embodiments, and its scope will be pointed out in the appended claims.

While the integrated circuit of the invention will be described in the context of a television receiver, it will be understood that its fundamental concepts are more generally applicable, being useful in broadcast or communication receivers for example.

When a television viewer rotates the channel selector and adjusts the fine tuning control of his receiver, he is actually varying the frequency of a local oscillator in the television tuner. The signal output of this oscillator is heterodyned with the composite television signal received at the antenna and amplified in the radio frequency stage. This action creates both the sum and difference frequencies, as well as the original local oscillator and radio frequencies, but all but the difference frequencies are filtered out. The remaining difference, or intermediate, frequencies are amplified and detected in the normal manner to recreate the desired audio and video information. If the local oscillator is for any reason not set at the proper frequency, the intermediate frequencies will be incorrect, and may deleteriously affect the reproduced sound and picture. As is well known, this mistuning may be due to improper fine tuning by the television viewer, local oscillator drift, or inaccurate resetability of the mechanical detenting action of the tuner.

The schematic circuit diagram of the drawing shows an example of specific circuitry embodying the automatic frequency control apparatus of the invention. The apparatus operates as a frequency discriminator to develop a control voltage which is representative of the sense and degree that the resultant intermediate frequency signal departs from the desired intermediate frequency signal. The control voltage is applied to a voltage responsive reactance device in the local oscillator of the television receiver to correct the mistuning of the oscillator and optimize the sound and picture reproduction.

The dashed rectangle 10 of the drawing schematically illustrates a monolithic semiconductor integrated circuit chip. The chip has a plurality of contact areas about its periphery, through which external connections to the circuits on the chip can be made. For example, the chip 10 has a pair of contact areas 11 and 12 which are coupled to a source of intermediate frequencies. The contact area 12 provides a common or ground potential contact area, which is connected to the various circuit-ground connections shown on the monolithic chip. As to physical dimensions, the chip 10 may be of the order of 50 mils × 50 mils, or smaller. The manner of implementing the various transistor, diode, capacitor and resistor functional portions described below in a monolithic chip is known in the art.

For ease of understanding, the automatic frequency control apparatus on the integrated chip 10 may be considered to be comprised of four stages: a buffer amplifier 20, a differential amplifier-detector 30, a bias supply 50 and an automatic gain control circuit 70. Intermediate frequency signals are supplied to the chip 10 by means of the contact areas 11 and 12, while direct current control signals indicative of their deviations from a reference frequency are derived at the amplifier-detector contact areas 13 and 14.

The buffer amplifier 20 comprises an intermediate frequency amplifier stage including transistors 21, 22 and 23 and a resistor 24. The collector electrode of transistor 21 is connected to a source of energizing potential (not shown) via a contact area 15, while the base electrode of transistor 21 is connected to the input signal contact area 11. The emitter electrode of the transistor 21 is coupled first, to the base electrode of the transistor 22 and second, through the resistor 24 to the reference potential contact area 12. The collector electrode of transistor 22 is, as shown, directly connected to the emitter electrode of transistor 23, the collector electrode of which is connected to a further contact area 16. The emitter electrode of transistor 22, finally, is connected to the contact area 12. Transistor 21 functions as an emitter follower amplifier and transistors 22 and 23 function as a cascode amplifier.

Contact area 11 may represent the input signal terminal for the automatic frequency control apparatus of the drawing. As shown, it is connected to one end of a parallel resonant circuit 100, the other end of which is connected through a coupling capacitor 101 to an input signal terminal 102. Terminal 102 may represent the output circuit of the video intermediate frequency amplifier of a television receiver, in which case the resonant circuit 100 may be tuned to 47.25 MHz. Such tuning is effective to pass the 45.75 MHz intermediate frequency video carrier and to trap or reject the adjacent channel sound carrier in the intermediate frequency band.

Contact area 16 is the output terminal of the buffer amplifier 20, and is connected to the primary winding 201 of a phase shift discriminator transformer 200 which is tuned near the 45.75 MHz video carrier frequency. The secondary winding 202 of the transformer 200 is connected between a pair of contact areas 17 and 18, and is tuned to the 45.75 MHz frequency. A tertiary winding 203 is connected between a center tap on the secondary winding 202 and a further contact area 19. As indicated in the drawing, the contact area 19 is also connected to the base electrode of the transistor 23.

The differential amplifier-detector 30, like that described in U.S. Pat. No. 3,519,944 includes five transistors 31, 32, 33, 34 and 35, a pair of load resistors 36 and 37, and a pair of filter capacitors 40 and 41. In accordance with the present invention, however, the stage 30 additionally includes a pair of "-holdoff" transistors 38 and 39, each of which is arranged in an emitter follower configuration. The transistors 38 and 39 serve to prevent the operation of the detector portion of the amplifier-detector 30 until signals applied to it via contact areas 17 and 18 exceed a predetermined threshold value or amplitude. This serves to reduce any undesired pull-in from adjacent channel signals which might otherwise occur and deleteriously affect the automatic frequency control provided.

The differential amplifier portion of the amplifier-detector 30 includes two transistors 31 and 32 arranged as an emitter-coupled pair, and a third transistor 33 arranged to serve as a constant current source. The emitter electrode of transistor 33 is connected to the reference contact area 12, while its collector electrode is connected to the common junction between the emitter electrodes of the transistors 31 and 32. The collector electrodes of these transistors 31 and 32 are each returned to the potential source contact area 15, that of the transistor 31 by way of load resistor 36 and that of the transistor 32 by way of load resistor 37. The base electrodes of the transistors 31 and 32 are similarly returned to the contact area 12, with the coupling from transistor 31 being via filter capacitor 40 and with the coupling from transistor 32 being via filter capacitor 41.

The base electrodes of transistors 31 and 32 are additionally coupled to receive the signals supplied by the discriminator transformer 200 to the contact areas 17 and 18. More particularly, the base emitter junction of the fourth transistor 34 is arranged to couple one end of the transformer secondary winding 202 to the base electrode of transistor 31, through contact area 17. Similarly, the base emitter junction of the fifth transistor 35 is arranged to couple the other end of the secondary winding 202 to the base electrode of transistor 32, through contact area 18. The collector electrodes of these transistors 34 and 35 are directly coupled to the potential source contact area 15, so that each of these two transistors is also arranged as an emitter follower amplifier. These transistors 34 and 35, together with the filter capacitors 40 and 41 and the input impedances of the transistors 31 and 32, comprise the detector portions of the differential amplifier-detector 30.

As was previously mentioned, the differential amplifier-detector 30 additionally includes two more transistors 38 and 39. The emitter and collector electrodes of the transistor 38 are respectively connected to corresponding electrodes of the transistor 34, while the same two electrodes of the transistor 39 are connected to corresponding electrodes of the transistor 35. The base electrodes of these two transistors 38 and 39 are biased from a point of direct potential different from that which biases the base electrodes of the transistors 34 and 35. This serves to inhibit the operation of the detector portion of the stage 30 until signals applied to it attain an amplitude comparable to this potential difference.

Also included in the differential amplifier-detector of the drawing are a resistor 42 and a semiconductor diode 43, serially connected between the contact areas 15 and 12. The base electrode of the current source transistor 33 is connected to the junction of these two components, with the anode of the semiconductor diode 43 being at this junction. By fabricating the semiconductor diode 43 on an integrated circuit chip together with the transistor 33 so as to match the characteristics of the respective rectifying junctions this parallel connection of the diode 43 and the base-emitter diode of the transistor 33 is such that the current flowing from the potential contact 15 through the resistor 42 will substantially equal the current flowing in the collector-emitter circuit of the transistor 33.

The bias supply 50 includes two transistors 51 and 52, three resistors 53, 54 and 55, a pair of Zener diodes 56 and 57, and a semiconductor diode 58. The collector electrode of the transistor 51 is, as shown, connected to the energizing potential contact area 15. The emitter electrode of that transistor 51 is also coupled first, directly to the base electrode of the transistor 52 and second, by way of the resistor 53 to the reference contact area 12. The emitter electrode of the transistor 52 is similarly direct coupled to the contact area 12 while its collector electrode is connected to the base electrode of the transistor 23 capacitively bypassed to ground via contact area 19 in the manner shown.

The Zener diodes 56 and 57 and the semiconductor diode 58 are serially connected between the contact areas 15 and 12 to provide regulation of the energizing potential applied to the contact area 15. The resistors 54 and 55 are serially connected between the collector electrode of the transistor 52 and the junction between the Zener diodes 56 and 57, as illustrated. With the values shown in the drawing, the Zener diode 56 is selected to provide a direct potential of approximately 5.5 volts positive at its junction with the Zener diode 57, and an approximately 0.1 volt direct voltage drop is established across the resistor 54. The end of resistor 54 which is remote from the collector electrode of transistor 52 is, as shown, connected to the base electrodes of "holdoff" transistors 38 and 39 of the amplifier-detector 30, and is at a more positive potential than is the end which is adjacent to the collector electrode of that transistor 52.

A pair of resistors 60 and 61 are additionally included, and serially couple the base electrode of transistor 51 of the bias stage 50 to the base electrode of transistor 21 of the buffer amplifier stage 20. Also, a direct connection is included between the collector electrode of the transistor 52 and the junction of the resistors 60 and 61.

The automatic gain control stage 70 of the automatic frequency control apparatus is included for purposes of preventing overload of the differential amplifier detector 30. As shown in the drawing, the stage 70 includes a transistor 71 and a pair of resistors 72 and 73. As indicated, resistor 72 couples the base electrode of the transistor 71 to the collector electrode of the transistor 33 in the amplifier-detector 30. The resistor 73 similarly couples the emitter electrode of transistor 71 to the reference contact area 12, and a direct connection is provided between the collector electrode of transistor 71 and the collector electrode of transistor 52 in the bias supply 50.

The operation of the automatic frequency control apparatus of the drawing is as follows. Under zero signal conditions, a direct potential positive with respect to ground is developed at the collector electrode of transistor 52 of the bias supply 50. This potential is of a value approximately equal to the sum of the base to emitter voltage drops of transistors 51 and 52 and the direct voltage drop due to base current through resistor 61. This direct collector potential is applied to bias the detector transistors 34 and 35 of the differential amplifier-detector 30 through the tertiary winding 203 of the discriminator transformer 200 and the upper half of the secondary winding 202 to the base electrode of transistor 34, and through the tertiary winding 203 and the bottom half of the secondary winding 202 to the base electrode of the transistor 35.

Under these same zero signal conditions, a direct potential positive with respect to ground is developed at the junction of resistors 54 and 55 of the supply 50. As was previously mentioned, this direct potential is 0.1 volt more positive than the direct potential at the collector electrode of transistor 52. The resulting direct potential at the junction of the resistors 54 and 55 is applied to the base electrodes of the transistor 38 and 39 of the amplifier-detector 30 to bias those transistors. The more positive direct potential serves to render the "holdoff" transistors 38 and 39 conductive and the detector transistors 34 and 35 nonconductive.

The constant current source transistor 33 of the differential amplifier-detector 30 establishes the total current which will flow through the transistors 31 and 32 of that stage. This current is determined by the value selected for the resistor 42 and by the energizing potential applied to the contact area 15. This current from the transistor 33 divides between the transistors 31 and 32 in accordance with their relative conductivities.

As is described in U.S. Pat. No. 3,519,944, the combination of elements corresponding to transistor 34, filter capacitor 40, and the base input impedance of transistor 31 forms a first peak rectifier or detector. Similarly, the combination of elements corresponding to transistor 35, filter capacitor 41 and the base input impedance of transistor 32 form a second detector. Because the input impedance of the transistors 31 and 32 is very high, the transistors 34 and 35 are substantially biased to cut off.

In that U.S. Pat. No. 3,519,944, no transistors corresponding to transistors 38 and 39 of the present drawing were included. In that arrangement, therefore, those transistors corresponding to transistors 34 and 35 of this application exhibited high sensitivity because substantially no threshold value had to be reached before detection occurred. The inclusion in the present apparatus of these transistors 38 and 39 establish a predetermined threshold level which serves to reduce any unwanted pull-in from adjacent channel signals. Such pull-in would deleteriously affect the operation of the apparatus of the invention.

In operation, intermediate frequency signals of a nominal 45.75 MHz frequency are applied to the terminal 102, and are coupled through the capacitor 101, the 47.25 MHz resonant trap 100, and the contact area 11 to the buffer amplifier 20. Transistors 21, 22 and 23 serve as a cascode amplifier providing linear operation independent of temperature variations in the integrated circuit environment of the drawing. This follows because of the tight feedback loop between the collector electrode of the transistor 52 and the base electrode of the transistor 51, so as to establish a direct potential of 2 $V_{be}$ at the input of the amplifier 20.

The discriminator transformer 200, in response to the signals developed by the buffer amplifier 20 at the contact area 16, imparts a phase shift to those signals which is proportional to the frequency difference between the applied signals and the frequency to which the discriminator transformer is tuned (i.e., the center frequency). At center frequency, the amplitude of the signals supplied at the contact areas 17 and 18 are equal. Offcenter frequency, one of the signals increases in amplitude while the other decreases.

The phase shift signals from the transformer 200 are coupled to the base electrodes of the detector transistors 34 and 35 via the contact areas 17 and 18. Since transistors 34 and 35 are parts of peak rectifier networks, any frequency deviation of the applied signal from the center or reference frequency thus produces a change in the direct voltage at the base electrode of differential amplifier transistor 31 which is equal in magnitude but in the opposite polarity direction to that produced at the base electrode of differential amplifier transistor 32.

At the center frequency, equal direct voltages are applied to the opposite sides of these transistors 31 and 32. With the component values shown in the drawing, the differential amplifier-detector 30 develops approximately 6.0 volts at both contact areas 13 and 14 at center frequency. For applied signal frequencies different from the center frequency, the differential amplifier portion of the stage 30 exhibits a differential mode gain of about 100 times, and discriminator characteristics of opposite polarity are traced out at contact areas 17 and 18, as shown at A and B of the drawing.

By returning the base electrodes of transistors 38 and 39 to a more positive bias voltage than the bias voltage at the base electrodes of the transistors 34 and 35, conduction in those latter two detector transistors is prevented or "held off" until a threshold value of signal is exceeded. With the circuit of the drawing, this conduction was prevented until the applied signal at the input terminal 11 had a value of the order of 1 millivolt. Adjacent channel signals having values less than this threshold will, therefore, produce no effect in the output voltage developed by the differential amplifier-detector 30.

The output voltage developed by the differential amplifier-detector 30 as a function of signal frequency is shown in the drawing as graphs C and D. The voltage characteristics C and D are of the form of the well-known discriminator characteristic, with the output voltage being about 6.2 volts at the 45.75 MHz center frequency $f_c$. Their 11 and 1.4 volts approximate maximum and minimum values were reached at approximately 50 kHz. deviation from that center frequency. The voltage characteristics C and D illustrate approximately a plus and minus 1.3 MHz pull-in range for the apparatus. This range is established by the Q and the coupling of the discriminator transformer 200.

The voltages developed at the output terminals 110 and 111 of the differential amplifier-detector 30 are used to control variable reactance circuitry in the local oscillator of the television tuner to control its frequency. In the case of a UHF tuner, the voltages developed at either one of these output terminals may be coupled in a known manner to change the capacitance exhibited by a varactor diode included in the frequency determining network of the oscillator. In the case of a VHF tuner, the voltages developed at these terminals may be coupled to the base and collector electrodes of a transistor included in the frequency determining network. Such an arrangement is disclosed in U.S. Pat. No. 3,422,369, wherein it is described how, with the emitter electrode open circuited, the transistor exhibits the characteristics of a voltage variable capacitor. In either case, the voltage responsive capacity device is selected to adjust the oscillator frequency so as to set the intermediate frequency signal at 45.75 MHz when the voltage developed at terminals 110 and 111 is plus 6.2 volts.

In cases of signal interference or reception of an extremely weak station, it may be desirable to fine tune the local oscillator manually. Such control is generally required also in setting up a detented or preprogrammed channel selector in the television receiver. For both VHF and UHF operations, the automatic frequency control action provided may be defeated by short circuiting the terminals 110 and 111. A corresponding 6.2 volt potential will nominally be developed at terminals 110 and 111 under such conditions. The fine tuning can then be accomplished in either mode of operation by manually varying a local oscillator reactance in a known manner. The automatic fine tuning control is reinstated upon removal of the respective short circuit.

The amplitude gain control characteristic of the apparatus of the drawing is as follows. As the amplitude of the supplied input signal at terminal 102 increases in magnitude, the direct voltage developed at the collector electrode of the constant current source transistor 33 increases. This collector electrode voltage increase is sensed by the automatic gain control transistor 71 to reduce the amplification provided by the buffer stage 20.

More particularly, the increase in direct voltage at the collector electrode of transistor 33 is in a direction to increase the conductivity of the transistor 71, and to lower the direct voltage developed at its collector electrode. This decrease in its collector electrode voltage is, in turn, in a direction to decrease the bias voltage applied to the buffer amplifier 20, to effect the gain control action. This decrease in collector voltage is also coupled through the discriminator transformer 200 to the base electrodes of the detector transistors 34 and 35 and through the resistor 54 to the base electrodes of the "holdoff" transistors 38 and 39. This coupling is substantially identical in the two cases and serves to inhibit any change in the automatic frequency control as a result of gain control action.

I claim:

1. Frequency discriminating apparatus comprising:

a differential amplifier having a pair of input terminals and a pair of output terminals;

first and second detector networks, each having an input terminal and an output terminal coupled to one of said pair of differential amplifier input terminals;

means for supplying input signal waves having a frequency within a band including a predetermined reference frequency;

a phase shift circuit tuned to said reference frequency and responsive to said signal waves for providing signals to the input terminals of said first and second detector networks which are shifted in phase with respect to said signal waves by an amount proportional to the frequency deviation of said waves from said reference frequency;

and means coupled to said detector networks for inhibiting the operation thereof until the amplitude of said signals exceeds a predetermined threshold value;

the apparatus being so constructed and arranged that direct voltages proportional to said frequency deviation are developed at said pair of differential amplifier output terminals.

2. Frequency discriminating apparatus as defined in claim 1 wherein each of said detector networks includes a first transistor having base and emitter electrodes respectively connected to the input and output terminals of said detector and a filter capacitor coupled between said detector output terminal and a point of reference potential, and wherein said inhibiting means includes means for biasing said detector transistors to a nonconducting condition for signals having an amplitude less than said threshold value.

3. Frequency discriminating apparatus as defined in claim 2 wherein said inhibiting means includes a second transistor having its collector and emitter electrodes respectively coupled to corresponding electrodes of said detector network transistor and having its base electrode coupled to a point of direct bias voltage different form that coupled to the base electrode of said detector transistor, to render said detector transistor nonconducting until the amplitude of said signals exceed said threshold value.

4. Frequency discriminating apparatus as defined in claim 3 wherein said differential amplifier includes a pair of transistors, each having base and collector electrodes respectively connected to the input and output terminals of said differential amplifier, and a further transistor coupled to each of their emitter electrodes for supplying a constant current thereto which divides in said amplifier transistors in accordance with the respective conductivities thereof.

5. Frequency discriminating apparatus as defined in claim 4 wherein said input signal supply means includes an amplifier stage and wherein there is further included: means coupled to said further transistor of said differential amplifier for deriving a direct voltage therefrom indicative of the amplitude of said supplied signals, and for coupling said direct voltage to said amplifier stage to vary the bias thereof so as to stabilize the amplitude of said signals provided said detector transistors once said threshold value is exceeded.

6. In combination:

first, second, third and fourth terminals;

first, second, third, fourth, fifth and sixth transistors;

a first resistor coupling the collector electrode of said first transistor to said first terminal;

a second resistor coupling the collector electrode of said second transistor to said first terminal;

a first capacitor coupling the base electrode of said first transistor to said second terminal;

a second capacitor coupling the base electrode of said second transistor to said second terminal;

means coupling the emitter electrodes of said first and second transistor to said second terminal;

direct current connections between the collector electrodes of said third, fourth, fifth and sixth transistors and said first terminal;

direct current connections between the emitter electrodes of said third and fourth transistors and the base electrode of said first transistor;

direct current connections between the emitter electrodes of said fifth and sixth transistors and the base electrode of said second transistor;

a first source of bias potential;

means for coupling said first source to the base electrodes of said third and said sixth transistors;

a second source of bias potential of value different from that provided by said first source;

means for coupling said second source to the base electrodes of said fourth and fifth transistors;

direct current connections from the collector electrodes of said first and second transistors to said third and fourth terminals, respectively;

means for supplying input signal waves having frequencies within a band including a predetermined reference frequency;

and a phase shift circuit tuned to said reference frequency and responsive to said signal waves for providing signals to the base electrodes of said third and sixth transistors which are shifted in phase with respect to said signal waves by an amount proportional to the frequency deviation of said waves from said reference frequency;

the apparatus being so constructed and arranged that direct signal voltages proportional to said frequency deviation are developed at said third and fourth terminals when the amplitude of said signals provided said third and sixth transistors exceeds the difference in voltage between said first and second sources of bias potential.